(12) United States Patent
Huang et al.

(10) Patent No.: US 10,109,486 B2
(45) Date of Patent: Oct. 23, 2018

(54) CUT FIRST SELF-ALIGNED LITHO-ETCH PATTERNING

(71) Applicant: Taiwan Semiconductor Manufacturing Co., Ltd., Hsin-Chu (TW)

(72) Inventors: Kuan-Wei Huang, Taoyuan (TW); Chia-Ying Lee, New Taipei (TW); Ming-Chung Liang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/633,152

(22) Filed: Jun. 26, 2017

(65) Prior Publication Data

US 2017/0294311 A1    Oct. 12, 2017

Related U.S. Application Data

(60) Division of application No. 15/202,842, filed on Jul. 6, 2016, now Pat. No. 9,698,016, which is a continuation of application No. 14/154,439, filed on Jan. 14, 2014, now Pat. No. 9,425,049.

(51) Int. Cl.
*H01L 21/44* (2006.01)
*H01L 21/033* (2006.01)
*H01L 21/768* (2006.01)
*H01L 21/461* (2006.01)

(52) U.S. Cl.
CPC ...... *H01L 21/0337* (2013.01); *H01L 21/0332* (2013.01); *H01L 21/0335* (2013.01); *H01L 21/461* (2013.01); *H01L 21/76816* (2013.01)

(58) Field of Classification Search
CPC ............. H01L 21/0337; H01L 21/0332; H01L 21/0335; H01L 21/461; H01L 21/76816
See application file for complete search history.

(56) References Cited

U.S. PATENT DOCUMENTS

| 7,611,980 | B2 | 11/2009 | Wells et al. |
| 7,871,909 | B1 | 1/2011 | Wang et al. |
| 8,343,874 | B2 | 1/2013 | Watanabe |

(Continued)

OTHER PUBLICATIONS

Zimmerman. "Double patterning lithography: double the trouble or double the fun?" SPIE Newsroom published in 2009.

(Continued)

*Primary Examiner* — Mark Tornow
(74) *Attorney, Agent, or Firm* — Eschweiler & Potashnik, LLC

(57) ABSTRACT

The present disclosure relates to an integrated chip formed by a self-aligned litho-etch process. In some embodiments, the integrated chip has a first plurality of shapes of an integrated chip layer arranged along a first direction at a first pitch. The first plurality of shapes include a first two shapes separated by a first end-to-end space along a second direction perpendicular to the first direction. A second plurality of shapes of the integrated chip layer are arranged along the first direction at a second pitch. The second plurality of shapes include a second two shapes separated by a second end-to-end space along the second direction. A ratio of the first end-to-end space to the second end-to-end space is approximately equal to 2.5:1.

20 Claims, 10 Drawing Sheets

(56) References Cited

U.S. PATENT DOCUMENTS

| | | | |
|---|---|---|---|
| 9,425,049 B2 | 8/2016 | Huang et al. | |
| 2010/0155959 A1 | 6/2010 | Park et al. | |
| 2012/0302057 A1* | 11/2012 | Arnold | H01L 21/0337 438/637 |
| 2014/0091434 A1* | 4/2014 | Hopkins | H01L 27/10894 257/618 |
| 2014/0213066 A1* | 7/2014 | Tung | H01L 21/0337 438/761 |
| 2015/0072531 A1* | 3/2015 | Tung | G03F 1/38 438/703 |
| 2015/0155171 A1* | 6/2015 | Chang | H01L 21/0338 438/703 |

OTHER PUBLICATIONS

Zhang, et al. "Mask Cost Reduction with Circuit Performance Consideration for Self-Aligned Double Patterning." Asia and South Pacific Design Automation Conference, published in 2011.
U.S. Appl. No. 14/154,454, filed Jan. 14, 2014.
Non-Final Office Action dated Jul. 8, 2015 for U.S. Appl. No. 14/154,454.
Final Office Action dated Nov. 9, 2015 for U.S. Appl. No. 14/154,454.
Notice of Allowance dated Feb. 16, 2016 for U.S. Appl. No. 14/154,454.
Non-Final Office Action dated Sep. 2, 2015 for U.S. Appl. No. 14/154,439.
Notice of Allowance dated Apr. 22, 2016 for U.S. Appl. No. 14/154,454.
Jo Finders ; Mircea Dusa ; Bert Vleeming ; Henry Megens ; Birgitt Hepp ; Mireille Maenhoudt ; Shaunee Cheng ; Tom Vandeweyer; Double patterning for 32nm and below: an update. Proc. SPIE 6924, Optical Microlithography XXI, 692408 (Mar. 18, 2008).
Chris Bencher ; Yongmei Chen ; Huixiong Dai ; Warren Montgomery ; Lior Huli; 22nm half-pitch patterning by CVD spacer self alignment double patterning (SADP). Proc. SPIE 6924, Optical Microlithography XXI, 69244E (Mar. 7, 2008).
Notice of Allowance dated May 5, 2017 in connection with U.S. Appl. No. 15/170,090.
Non-Final Office Action dated Nov. 3, 2016 for U.S. Appl. No. 15/202,842.
Notice of Allowance dated Feb. 27, 2017 for U.S. Appl. No. 15/202,842.

* cited by examiner

CUT FIRST SELF-ALIGNED LITHO-ETCH PATTERNING

REFERENCE TO RELATED APPLICATION

This Application is a Divisional of U.S. application Ser. No. 15/202,842 filed on Jul. 6, 2016, which is a Continuation of U.S. application Ser. No. 14/154,439 filed on Jan. 14, 2014 (now U.S. Pat. No. 9,425,049 issued on Aug. 23, 2016). The contents of the above-referenced matters are hereby incorporated by reference in their entirety.

BACKGROUND

The semiconductor industry has continually improved the speed and power of integrated circuits (ICs) by reducing the size of components (e.g., transistor devices) within the ICs. In large part, the ability to scale the size of components within an integrated chip is driven by lithographic resolution. However, in recent technology nodes tool vendors have been unable to decrease the wavelength of photolithography exposure tools (e.g., to successfully implement EUV lithography), so that developing technology nodes often have minimum feature sizes smaller than the wavelength of illumination used in the photolithography tools.

Double patterning lithography (DPL) has become one of the most promising lithography technologies for printing critical design layers (e.g., polysilicon, thin metal routing, etc.) in sub-22 nm technology nodes. However, some double patterning technologies (e.g., litho-etch, litho-etch) suffer from misalignment and overlay problems that degrade integrated chip performance. In recent years, self-aligned double patterning (SADP) has emerged as a double patterning technology that is able to avoid such misalignment and overlay errors.

DETAILED DESCRIPTION

Figure 1:
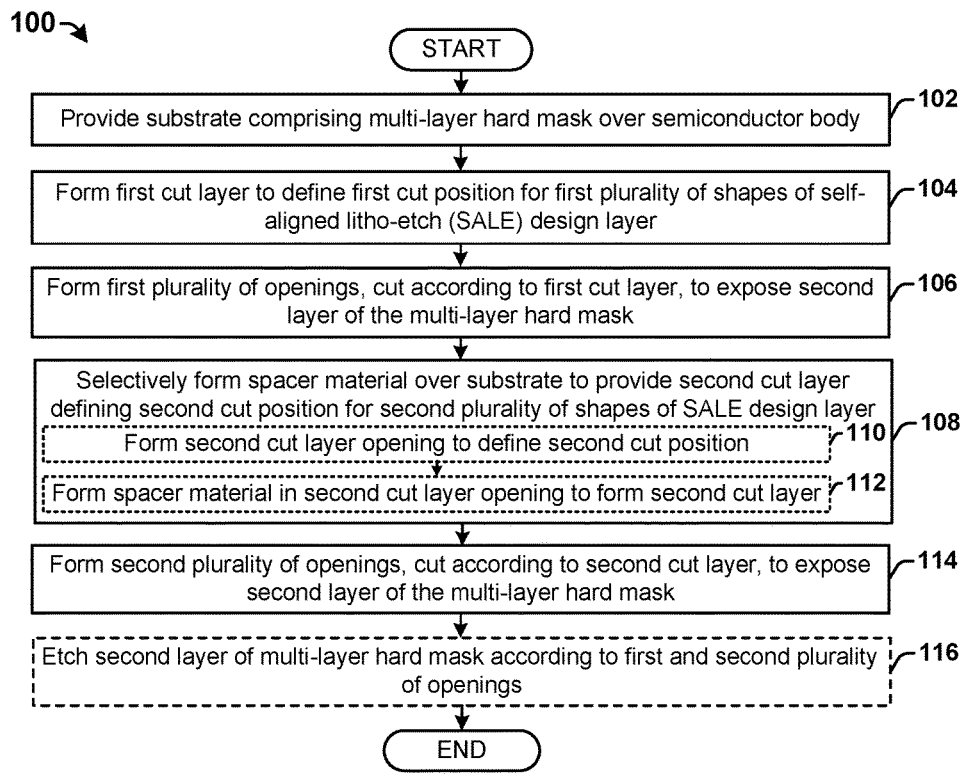
FIG. 1 illustrates some embodiments of a flow diagram of a method of performing a self-aligned litho-etch (SALE) process.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Self-aligned double patterning (SADP) technologies have been useful in forming repetitive structures such as memory arrays (e.g., SRAM memory arrays). For example, the repetitive structure of SRAM memory array bit lines and/or control lines allows for a spacer layer to be formed on sidewalls of minimum pitch openings in a patterned photoresist layer formed over a substrate during a first photolithography process. After formation of the spacer layer on the sidewalls, the patterned photoresist layer can be removed using a second photolithography process, leaving spacers separated by a space smaller than that achievable by the first photolithography process (e.g., since there are two spacers within a line). The substrate can be selectively patterned according to the spacer layer to form a dense array of lines.

A cut mask may be used to form line-end to line-end spaces in the dense array of lines. However, current SADP processes provide for end-to-end spaces between shapes formed using the second photolithography process that are larger than the end-to-end spaces between shapes formed using the first photolithography process. This is because cuts of shapes formed by the first photolithography process are performed before the shapes are lithographically formed, thereby providing for a space that can be defined by a spacer material. In contrast, cuts formed by the second photolithography process are determined by the photolithography process and therefore are limited by photo resist worse top loss profile. To further decrease the size of an IC layout, such as an SRAM cell, the end-to-end space achieved by the second photolithography process should be reduced.

Accordingly, some aspects of the present disclosure relate to a method and apparatus for performing a self-aligned litho-etch process that provides for small line-end to line-end space. In some embodiments, the method comprises providing a substrate having a multi-layer hard mask having a first layer and an underlying second layer. A first cut layer is formed over the substrate. A first plurality of openings, cut according to the first cut layer, are formed to expose the second layer at a first plurality of positions corresponding to a first plurality of shapes of a SALE design layer. A spacer material is deposited onto sidewalls of the multi-layer hard mask to form a second cut layer. A second plurality of openings, cut according to the second cut layer, are formed to expose the second layer at a second plurality of positions corresponding to a second plurality of shapes of the SALE design layer. The second layer is etched according to the first and second plurality of openings. By forming the first and second cut layers prior to performing photolithography processes that form the first and second plurality of openings, the end-to-end spaces of the first and second plurality of shapes can be reduced since the end-to-end spaces are not limited by photolithography resolution.

FIG. 1 illustrates some embodiments of a flow diagram of a method 100 of performing a self-aligned litho-etch (SALE) process. The method 100 comprises a 'cut first' method since it increases a line-end space defined by a first cut layer formed prior to forming openings in a multi-layer hard mask that correspond to a first plurality of shapes of a SALE design layer.

At 102, a substrate is provided. In some embodiments, the substrate may comprise one or more dielectric layers disposed over a semiconductor body. In some embodiments, the substrate further comprises a multi-layer hard mask disposed over the one or more dielectric layers. The multi-layer hard mask may comprise a first layer and an underlying second layer.

At 104, a first cut layer is selectively formed over the substrate to define a first cut position for a first plurality of shapes of a self-aligned litho-etch (SALE) design layer. The first cut layer is configured to define spaces, or 'cuts', in the first plurality of shapes along a line-end, so as to form an end-to-end space between lines defined by the first plurality of shapes. In some embodiments, the first cut layer is formed by depositing a blocking layer over the multi-layer hard mask.

At 106, a first plurality of openings, which are cut according to the first cut layer, are formed to expose the second layer of the multi-layer hard mask. In some embodiments, the multi-layer hard mask is etched according to a first patterned photoresist layer and the first cut layer to form the first plurality of openings.

At 108, a spacer material is selectively formed over the substrate to provide a second cut layer defining a second cut position for a second plurality of shapes of the SALE design layer. The second cut layer is configured to 'cut' the second plurality of shapes along a line-end to form an end-to-end space between lines defined by the second plurality of shapes. In some embodiments, the first plurality of shapes are interleaved between the second plurality of shapes.

In some embodiments, the second cut layer is formed by forming a second cut layer opening within the multi-layer hard mask, at 110. A spacer material is then formed within the second cut layer opening to form the second cut layer, at 112.

At 114, a second plurality of openings, which are cut according to the second cut layer, are formed to expose the second layer of the multi-layer hard mask. In some embodiments, the multi-layer hard mask is etched according to a second patterned photoresist layer and the spacer material comprising the second cut layer to form the second plurality of openings.

At 116, the second layer of the multi-layer hard mask may be selectively etched according to the first plurality of openings and the second plurality of openings. In some embodiments, one or more of the dielectric layers of the substrate may be subsequently etched according to the second layer of the multi-layer hard mask.

Thus, by forming a first and second cut layers prior to performing photolithography processes that open the first and second plurality of openings, method 100 provides for end-to-end spaces of the first and second plurality of shapes that are not limited by photolithography resolution.

Figure 2:
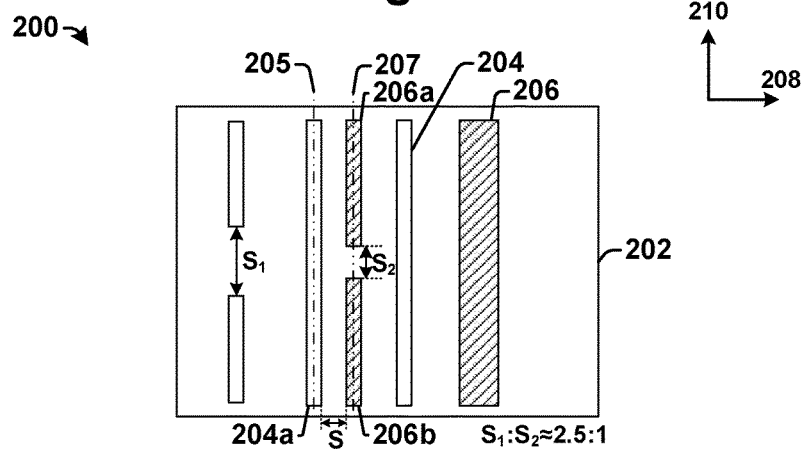
FIG. 2 illustrates some embodiments of an integrated chip formed according to the method of performing a self-aligned litho-etch process.

FIG. 2 illustrates some embodiments of an integrated chip 200 formed according to the method of performing a self-aligned litho-etch process.

The integrated chip 200 comprises a first plurality of shapes 204 and a second plurality of shapes 206 disposed on an integrated chip die 202. The first plurality of shapes 204 and the second plurality of shapes 206 are comprised within a SALE design layer (i.e., a design layer formed using a SALE lithography process). In some embodiments, the first plurality of shapes 204 may be formed using a first photolithography process of a SALE process, while the second plurality of shapes 206 may be formed using a second photolithography process of the SALE process. In some embodiments, the SALE design layer may comprise a gate layer or a back-end-of-the-line metallization layer, for example.

Shapes from the first plurality of shapes 204 and the second plurality of shapes 206 may be separated in a first direction 208 by a space S that is less than a minimum space achievable using a single photomask (i.e., a G0-space). For example, in integrated chip 200 a shape 204a of the first plurality of shapes is located along a first line 205 extending in a second direction 210 and adjacent shapes, 206a and 206b, of the second plurality of shapes 206 are located along a second line 207 extending in the second direction 210. Shapes 206a and 206b are separated from shape 204a in the first direction 208 by a space S less than a G0-space.

Two or more of the first plurality of shapes 204 aligned in the second direction 210 are disposed in a pattern having a first end-to-end space of $S_1$. Two or more of the second plurality of shapes 206 aligned in the second direction 210 are disposed in a pattern having a second end-to-end space of $S_2$. The ratio of the first and second end-to-end spaces $S_1:S_2$ is approximately equal to 2.5:1.

In some embodiments, integrated chip 200 may comprise an SRAM (static-random access memory) array, wherein the first plurality of shapes 204 and the second plurality of shapes 206 comprise a plurality of bit lines. In other embodiments, integrated chip 200 may comprise an SRAM (static-random access memory) array, wherein the first plurality of shapes 204 and the second plurality of shapes 206 comprise a plurality of control lines. In yet other embodiments, integrated chip 200 may comprise a back-end-of-the-line routing section or a transistor gate section.

Figure 3:
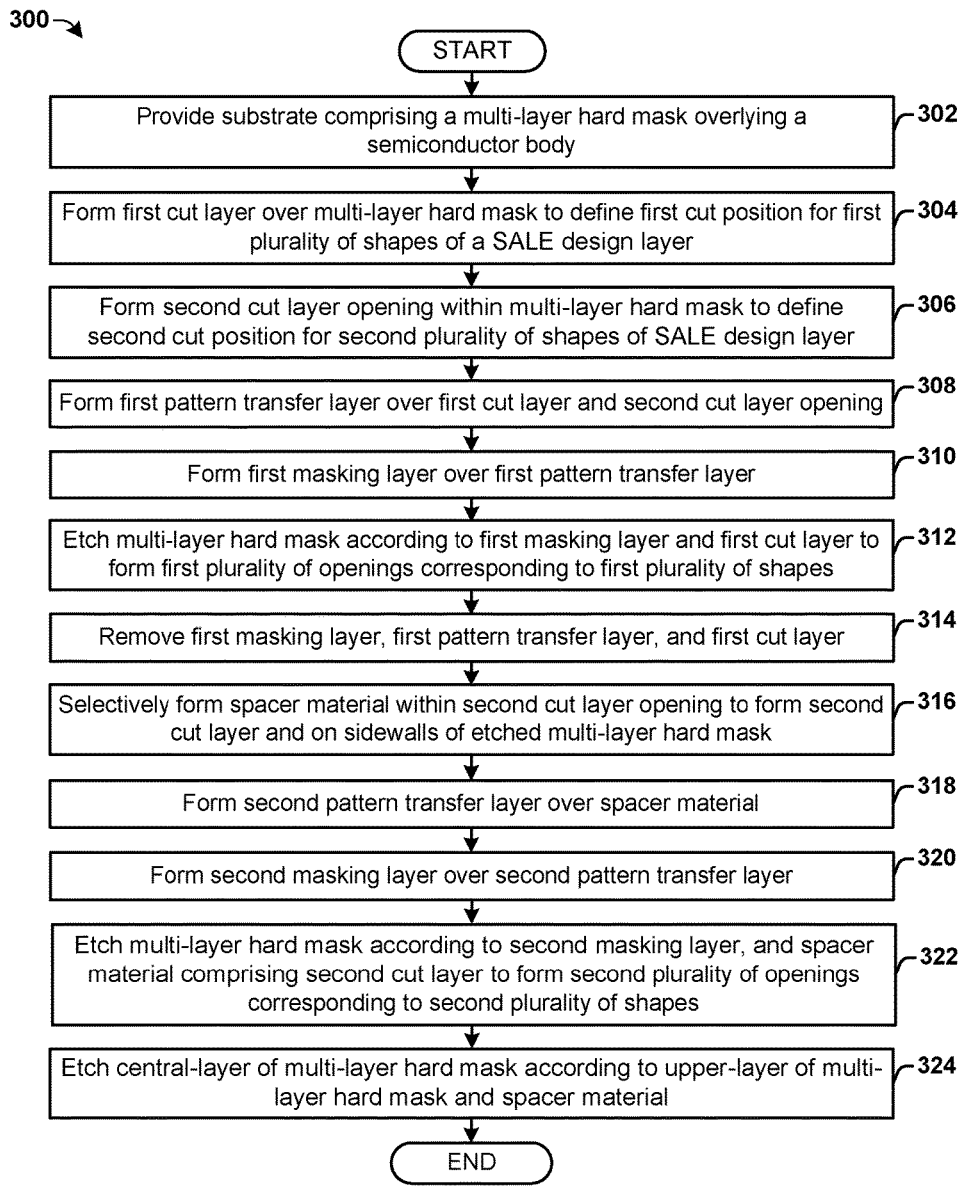
FIG. 3 illustrates some embodiments of a flow diagram of a method of performing a self-aligned litho-etch process.

FIG. 3 illustrates some embodiments of a flow diagram of a method 300 of performing a self-aligned litho-etch process.

While the disclosed methods (e.g., methods 100, 300, and/or 1200) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302, a substrate comprising a multi-layer hard mask overlying a semiconductor body is provided. In some embodiments, the multi-layer hard mask comprises a tri-layer hard mask having an upper-layer, a central-layer, and a lower-layer.

At 304, a first cut layer is selectively formed over the multi-layer hard mask to define a first cut position for a first plurality of shapes of a SALE design layer formed using a first photolithography process of a SALE process. The first cut layer corresponds to a first cut layer configured to cut the first plurality of shapes along a line end to form an end-to-end space between lines defined by the first plurality of shapes. In some embodiments, the first cut layer may comprise a blocking layer disposed onto the multi-layer hard mask. In some embodiments, the SALE design layer may be comprised an SRAM (static random access memory) array.

At 306, a second cut layer opening is selectively formed within the multi-layer hard mask to define a second cut position for a second plurality of shapes of the SALE design layer formed using a second photolithography process of the SALE process. The second cut layer opening defines a position of a second cut layer configured to cut the second plurality of shapes along a line end to form an end-to-end space between lines defined by the second plurality of shapes. In some embodiments, the second cut layer opening may comprise an opening in the upper-layer of the multi-layer hard mask.

At 308, a first pattern transfer layer is formed over the first cut layer and the second cut layer opening.

At 310, a first masking layer is formed over the first pattern transfer layer. In some embodiments, the first masking layer may comprise a first patterned photoresist layer.

At 312, the multi-layer hard mask is selectively etched according to the first masking layer and the first cut layer to form a first plurality of openings in the multi-layer hard mask corresponding to the first plurality of shapes. In some embodiments, the upper-layer of the multi-layer hard mask is selectively etched according to the first masking layer and the first cut layer via the first pattern transfer layer to form the first plurality of openings in the upper-layer.

At 314, the first masking layer, the first pattern transfer layer, and the first cut layer are removed.

At 316, a spacer material is selectively formed to fill the second cut layer opening in the multi-layer hard mask to form a second cut layer, and onto the sidewalls of the etched multi-layer hard mask.

At 318, a second pattern transfer layer is formed over the spacer material.

At 320, a second masking layer is formed at a position overlying the second pattern transfer layer. In some embodiments, the second masking layer may comprise a second patterned photoresist layer.

At 322, the multi-layer hard mask is selectively etched according to the second masking layer and spacer material comprising the second cut layer to form a second plurality of openings corresponding to the second plurality of shapes. The second plurality of openings are defined by the multi-layer hard mask and the spacer material disposed onto sidewalls of the etched multi-layer hard mask. In some embodiments, an upper-layer of the multi-layer hard mask is selectively etched according to the second masking layer via the second pattern transfer layer to form the second plurality of openings in the upper-layer.

At 324, the central-layer of the multi-layer hard mask is selectively etched according to the first and second plurality of openings.

In some embodiments, the lower-layer of the multi-layer hard mask may be selectively etched according to the central-layer of the multi-layer hard mask, and the underlying substrate (e.g., one or more dielectric layers) may be further etched according to the lower-layer (e.g., to form openings for a thin metal layer).

FIGS. 4-11 show some embodiments of substrates that illustrate the method 300 of performing a self-aligned litho-etch process. It will be appreciated that although FIGS. 4-11 are described with respect to method 300, the illustrations are not limited to method 300.

Figure 4:
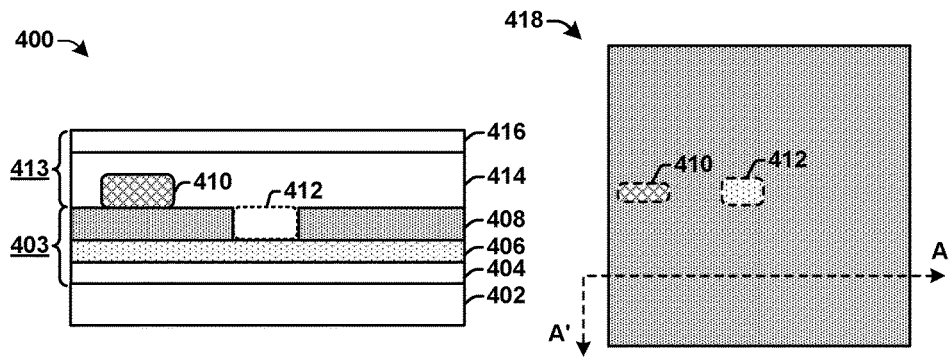
FIGS. 4-11 illustrate some embodiments of exemplary substrates showing a method of performing a self-aligned litho-etch process.

FIG. 4 illustrates some embodiments of a cross-sectional view 400 (along cross-sectional line A-A') and a corresponding top-view 418 of a substrate corresponding to acts 302-308.

As shown in cross-sectional view 400, a tri-layer hard mask 403 is disposed over a semiconductor body 402. The tri-layer hard mask 403 comprises a lower-layer 404, a central-layer 406, and an upper-layer 408. In some embodiments, the lower-layer 404 comprises a titanium nitride (TiN) layer disposed over the semiconductor body 402. In some embodiments, the central-layer 406 comprises a TEOS layer disposed over the TiN layer. In some embodiments, the upper-layer 408 comprises a silicon layer disposed over the TEOS layer.

A first cut layer 410 is selectively formed over the tri-layer hard mask 403 to define a first cut position for a first plurality of shapes of a SALE design layer formed using a first photolithography process of the SALE lithography process. In some embodiments, the first cut layer 410 is formed by depositing a layer of hard mask material onto the upper-layer 408 of the tri-layer hard mask 403. The layer of hard mask material is then selectively etched to remove the hard mask material in areas excluding the first cut layer 410. In some embodiments, the hard mask material may be etched using a multi-step etching process. For example, the hard mask material may be etched using a main etch with a first etching selectivity and an over etch with a much larger etching selectivity. In some embodiments, the first cut layer 410 may be deposited by way of a vapor deposition technique (e.g., chemical vapor deposition, physical vapor deposition, etc.).

In some embodiments, the hard mask material is selectively etched using an etchant having an etching selectivity that causes the hard mask material to be etched faster than the upper-layer 408 of the tri-layer hard mask 403. The etching selectivity allows for the hard mask material to be patterned without removing the underlying upper-layer 408 of the tri-layer hard mask 403. For example, in some embodiments, the first cut layer 410 may comprise titanium nitride (TiN). In such embodiments, the etching selectivity of TiN to an underlying silicon layer is 2.3 during a main etching step (i.e., the TiN layer etches 2.3 times faster than the Si layer). In other embodiments, the first cut layer 410 may comprise titanium oxide (TiO) or other films exhibiting an etching selectivity of greater than 6 with respect to the upper-layer 408 (e.g., silicon) of the tri-layer hard mask 403 (i.e., etching 6 times faster than the upper-layer 408).

A second cut layer opening 412 is selectively formed within the tri-layer hard mask 403 to define a second cut position for a second plurality of shapes of the SALE design layer formed using a second photolithography process of a SALE lithography process. In some embodiments, the second cut layer opening 412 is formed by selectively etching the upper-layer 408 of the tri-layer hard mask 403 to form an opening that exposes the underlying central-layer 406.

A first pattern transfer layer 413 is formed over the first cut layer 410 and the second cut layer opening 412. The first pattern transfer layer 413 is configured to transfer a pattern from an overlying first photoresist layer to the upper-layer 408 of the tri-layer hard mask 403. In some embodiments, the first pattern transfer layer 413 may comprise a bottom layer 414 formed over the first cut layer 410 and the second cut layer opening 412, and a middle layer 416 formed over the bottom layer 414. In some embodiments, the bottom layer 414 may comprise a carbon layer or a hydrogen layer deposited using a vapor deposition technique or a spin-on technique. In some embodiments, the middle layer 416 may comprise a silicon oxide.

Figure 5:
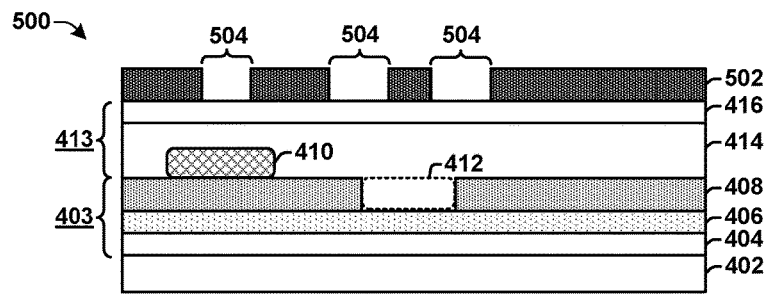

FIG. 5 illustrates some embodiments of a cross-sectional view 500 of a substrate corresponding to act 310.

As shown in cross-sectional view 500, a first patterned photoresist layer 502 is formed over the first pattern transfer layer 413. The first patterned photoresist layer 502 comprises openings 504 that correspond to locations of the first plurality of design shapes on the SALE design layer. In some embodiments, the first patterned photoresist layer 502 may be deposited by way of a spin-coating process. The first patterned photoresist layer 502 is subsequently patterned by way of a photo-lithography process that selectively exposes the first patterned photoresist layer 502 to radiation having a pattern corresponding to a photomask. Selective areas of the first patterned photoresist layer 502 are subsequently removed by a developer to form the openings 504.

Figure 6:
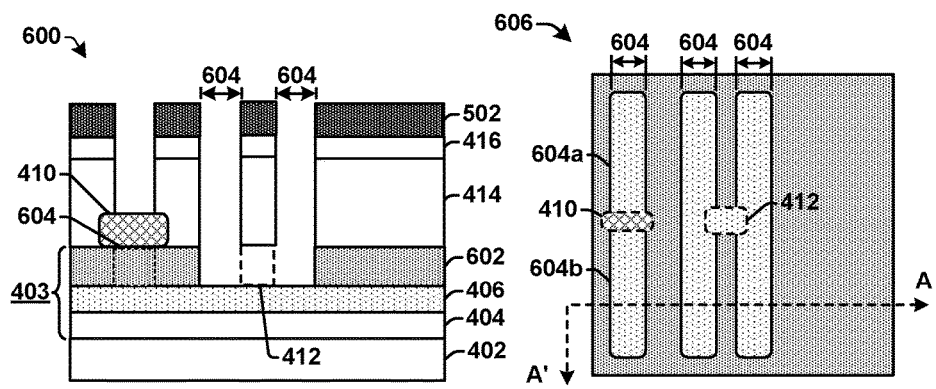

FIG. 6 illustrates some embodiments of a cross-sectional view 600 and a corresponding top-view 606 of a substrate corresponding to act 312.

As shown in cross-sectional view 600, the upper-layer 602 of the tri-layer hard mask 403 is etched according to the first patterned photoresist layer 502 and the first cut layer 410 to form a first plurality of openings 604 in the upper-layer 602 corresponding to the first plurality of shapes. Etching the tri-layer hard mask 403 selectively removes portions of the upper-layer 602 of the tri-layer hard mask 403 to form the first plurality of openings 604, which expose the central-layer 406. Since the first cut layer 410 comprises a blocking layer overlying the upper-layer 602 of the tri-layer hard mask 403 the underlying central-layer 406 of the tri-layer hard mask 403 is not exposed in the area of the first cut layer 410. Since the second cut layer opening 412 comprises an opening in the upper-layer 602, the underlying central-layer 406 is exposed in the area of second cut layer opening 412.

In some embodiments, the upper-layer 602 of the tri-layer hard mask 403 is etched using an etchant having an etching selectivity that causes the upper-layer 602 to be etched faster than the first cut layer 410. Such an etching selectivity allows for the upper-layer 602 to be patterned in areas not covered by the first cut layer 410. For example, in some embodiments, the first cut layer 410 may comprise titanium nitride (TiN) and the upper-layer 602 may comprise silicon. In such embodiments, the etching selectivity of the TiN to the underlying silicon is between approximately 6 and 20 during a main etching step (i.e., the silicon etches between 6 and 20 times faster than the TiN layer). In some embodiments, the silicon may be etched using a multi-step etching process (e.g., a main etch with a first etching selectivity and an over etching step using a much larger etching selectivity).

In some embodiments, the upper-layer 602 may be etched via the first pattern transfer layer 413. For example, the middle layer 416 may be selectively etched according to the first patterned photoresist layer 502 to transfer the pattern of the first patterned photoresist layer 502 to the middle layer 416. Similarly, the bottom layer 414 is selectively etched according to the middle layer 416 to transfer the pattern of the middle layer 416 to the bottom layer 414. By transferring the pattern of the first patterned photoresist layer 502 to the upper-layer 602 of the tri-layer hard mask 403, the first pattern transfer layer 413 improves critical dimension (CD) control of the upper-layer 602 (e.g., roughness and verticalness of resist pattern that could affect the CD uniformity of final pattern are reduced).

As shown in top-view 606, the first plurality of openings 604 formed by etching the upper-layer 602 of the tri-layer hard mask 403 according to the first patterned photoresist layer 502 and the first cut layer intersect the second cut layer opening 412 to form an 'H' shaped opening in the upper-layer 602 of the tri-layer hard mask 403. The first plurality of openings 604 further abut the first cut layer 410 in a manner such that the first cut layer 410 separates openings 604a and 604b.

Figure 7:
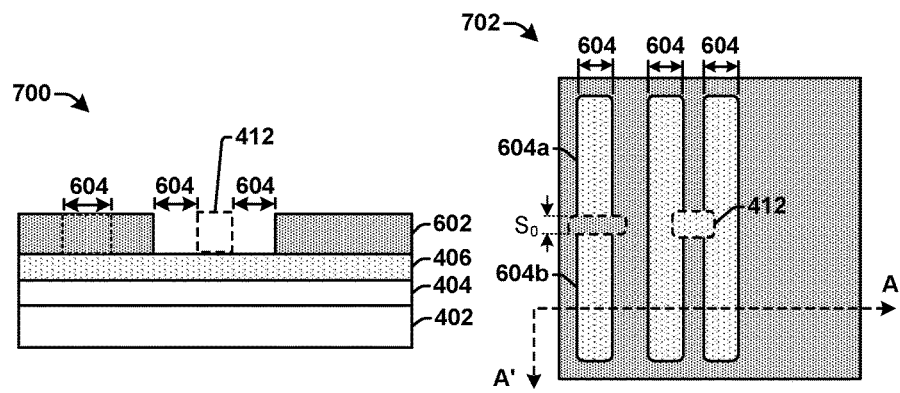

FIG. 7 illustrates some embodiments of a cross-sectional view 700 and a corresponding top-view 702 of a substrate corresponding to act 314.

As shown in cross-sectional view 700, the first cut layer 410 is removed. In some embodiments, the first cut layer 410 may be removed by an etchant having an etching selectivity that etches first cut layer 410 faster than the upper-layer 602 of the multi-layer hard mask.

As shown in top-view 702, removal of the first cut layer 410 results in the upper-layer 602 of the tri-layer hard mask 403 extending between openings 604a and 604b. The width of the upper-layer 602 of the tri-layer hard mask 403 between openings 604a and 604b is $S_0$.

Figure 8:
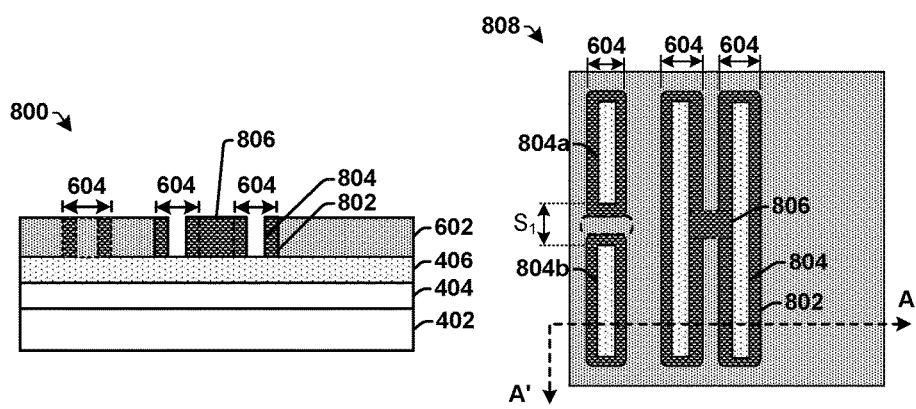

FIG. 8 illustrates some embodiments of a cross-sectional view 800 and a corresponding top-view 808 of a substrate corresponding to act 314.

As shown in cross-sectional view 800, a spacer material 802 is formed onto sidewalls of openings in the etched upper-layer 602 of the tri-layer hard mask 403. The spacer material 802 fills the second cut layer opening 412 in the multi-layer hard mask 403 to form a second cut layer 806. In some embodiments, the spacer material 802 may be formed by depositing spacer material over the substrate and by subsequently etching the spacer material to remove the spacer material from horizontal surfaces. The resulting spacer material 802 remains on sidewalls of the etched upper-layer 602 of the tri-layer hard mask 403 leaving reduced width openings 804 exposing the underlying central-layer 406 of the tri-layer hard mask 403 at locations defining the first plurality of shapes.

As shown in top-view 808, the spacer material 802 forms a border around the openings 804 in the upper-layer 602 of the tri-layer hard mask 403, thereby reducing the width of openings 804 exposing the central-layer 406 of the tri-layer hard mask 403. The spacer material 802 forms a first end-to-end space $S_1$ between openings 804a and 804b.

Figure 9:
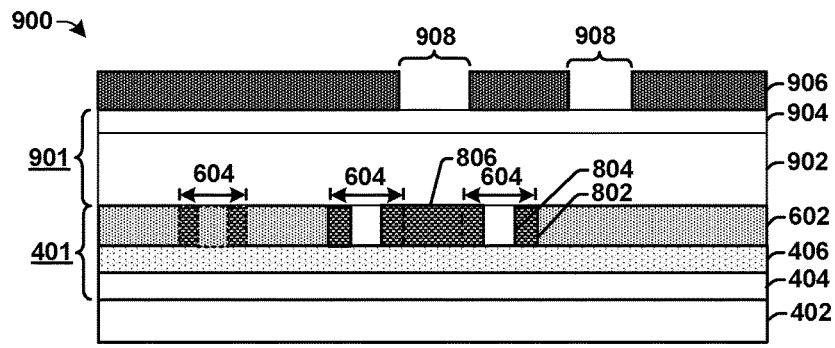

FIG. 9 illustrates some embodiments of a cross-sectional view 900 of a substrate corresponding to acts 318-320.

As shown in cross-sectional view 900, a second pattern transfer layer 901 is formed overly the spacer material 802. In some embodiments, the second pattern transfer layer 901 comprises a bottom layer 902 deposited over the spacer material 802 and a middle layer 904 deposited over the bottom layer 902. A second patterned photoresist layer 906 is formed over the second pattern transfer layer 901. The second patterned photoresist layer 906 comprises openings 908 that correspond to locations of the second plurality of shapes of the SALE design layer.

Figure 10:
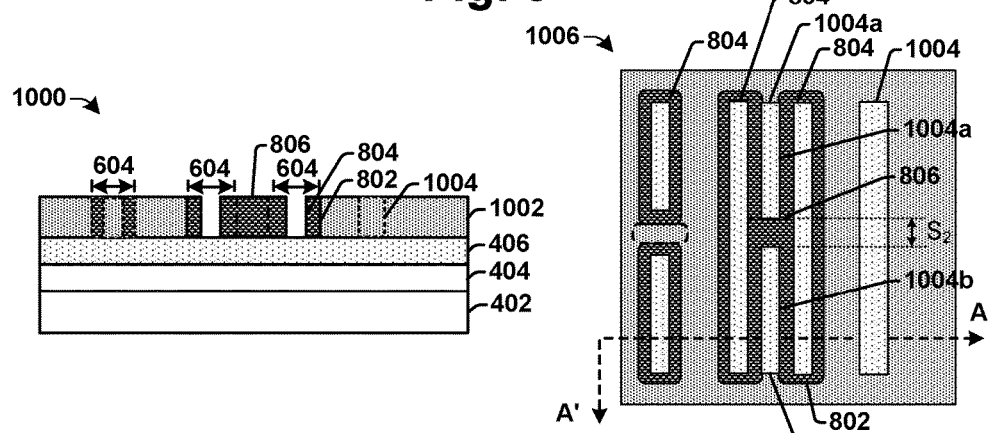

FIG. 10 illustrates some embodiments of a cross-sectional view 1000 and a corresponding top-view 1006 of a substrate corresponding to act 322.

As shown in cross-sectional view 1000, the upper-layer 1002 of the tri-layer hard mask 403 is selectively etched according to the second patterned photoresist layer 906 and the spacer material 802 comprising the second cut layer 806 to form a second plurality of openings 1004 corresponding to the second plurality of shapes. Etching the upper-layer 1002 removes portions of the upper-layer 1002 of the tri-layer hard mask 403 to form the second plurality of openings 1004, which expose the central-layer 406. As shown in top-view 1006, the second cut layer 806 forms a second end-to-end space $S_2$ between openings 1004a and 1004b. A ratio of the first end-to-end space $S_1$ to the second end-to-end space $S_2$ is approximately equal to 2.5:1.

Figure 11:
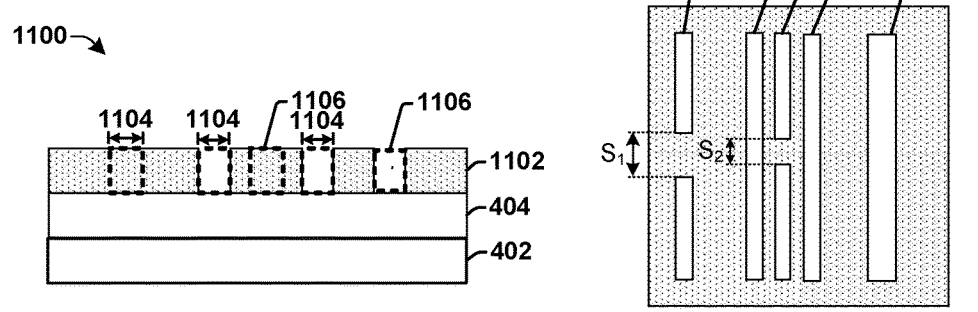

FIG. 11 illustrates some embodiments of a cross-sectional view 1100 and a corresponding top-view 1108 of a substrate corresponding to act 324.

As shown in cross-sectional view 1100 and top-view 1108, the central-layer 1102 of the tri-layer hard mask 403 is selectively etched according to the first and second plurality of openings, 604 and 1004, defined by the upper-layer 1002 and the spacer material 802, to respectively form openings 1104 and 1106 in the central-layer 1102.

Figure 12:
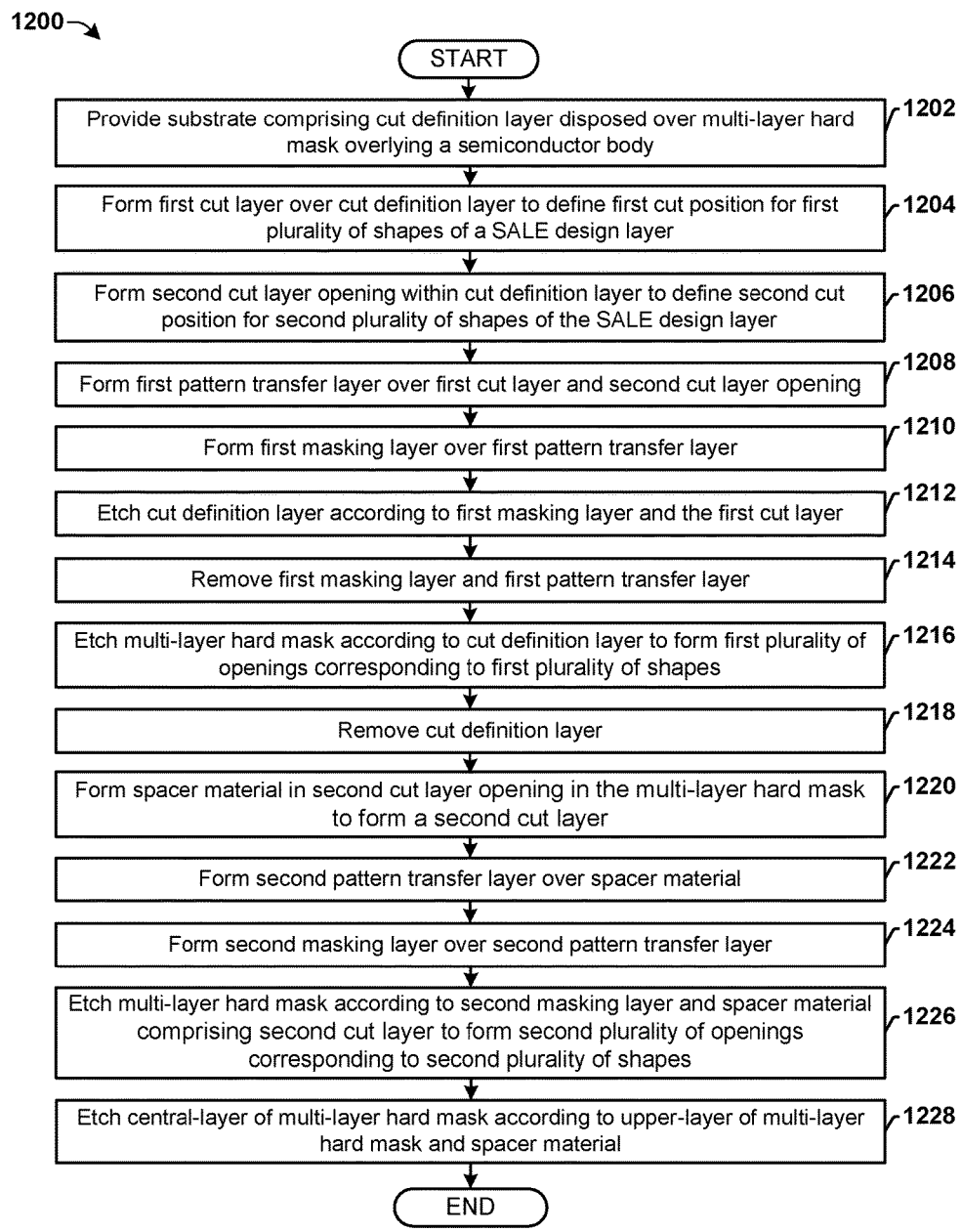
FIG. 12 illustrates some alternative embodiments of a flow diagram of a method of performing a self-aligned litho-etch process.

FIG. 12 illustrates some alternative embodiments of a flow diagram of a method 1200 of performing a self-aligned litho-etch process.

At 1202, a substrate comprising a cut definition layer disposed over a multi-layer hard mask overlying a semiconductor body is provided. In some embodiments, the multi-layer hard mask comprises a tri-layer hard mask having an upper-layer, a central-layer, and a lower-layer. In some embodiments, the cut definition layer may comprise a bottom layer, a middle layer, a hard mask layer, and a blocking layer. In some embodiments, the middle layer and the blocking layer may comprise a first low-temperature film, while the hard mask layer may comprise a different second low-temperature film.

At 1204, a first cut layer is selectively formed over the cut definition layer to define a first cut position for a first plurality of shapes of a SALE design layer formed using a first photolithography process of a SALE process. In some embodiments, the first cut layer may comprise a blocking layer disposed onto the hard mask layer.

At 1206, a second cut layer opening is selectively formed within the cut definition layer to define a second cut position for a second plurality of shapes of the SALE design layer formed using a second photolithography process of the SALE process. In some embodiments, the second cut layer opening may comprise an opening in the hard mask layer.

At 1208, a first pattern transfer layer is formed over the first cut layer and the second cut layer opening.

At 1210, a first masking layer is formed over the first pattern transfer layer. In some embodiments, the first masking layer may comprise a first patterned photoresist layer.

At 1212, the cut definition layer is selectively etched according to a first masking layer and the first cut layer. In some embodiments, the cut definition layer is selectively etched via the first pattern transfer layer.

At 1214, the first masking layer and the first pattern transfer layer are removed.

At 1216, the multi-layer hard mask is selectively etched according to the cut definition layer and the second cut layer to form a first plurality of openings in the multi-layer hard mask corresponding to the first plurality of shapes. Etching the multi-layer hard mask according to the second cut layer forms a multi-layer second cut layer opening in the multi-layer hard mask.

At 1218, the cut definition layer is removed.

At 1220, a spacer material is selectively formed to fill the multi-layer second cut layer opening to form a second cut layer, and onto the sidewalls of the etched multi-layer hard mask At 1222, a second pattern transfer layer is formed over the spacer material.

At 1224, a second masking layer is formed over the second pattern transfer layer. In some embodiments, the second masking layer may comprise a second patterned photoresist layer.

At 1226, the multi-layer hard mask is selectively etched according to the second masking layer and spacer material comprising the second cut layer to form a second plurality of openings corresponding to the second plurality of shapes. The second plurality of openings are defined by the multi-layer hard mask and the spacer material disposed onto sidewalls of the etched multi-layer hard mask. In some embodiments, the multi-layer hard mask is selectively etched via the second pattern transfer layer to form the second plurality of openings in the upper-layer.

At 1228, the central-layer of the multi-layer hard mask is selectively etched according to the first and second plurality of opening.

In some embodiments, the lower-layer of the multi-layer hard mask may be selectively etched according to the central-layer of the multi-layer hard mask. In some embodiments, and the underlying substrate (e.g., one or more dielectric layers) may be further etched according to the lower-layer (e.g., to form openings for a thin metal layer).

FIGS. 13-20 show some embodiments of substrates that illustrate the method 1200 of performing a self-aligned litho-etch process. It will be appreciated that although FIGS. 13-20 are described with respect to method 1200, the illustrations are not limited to method 1200.

Figure 13:
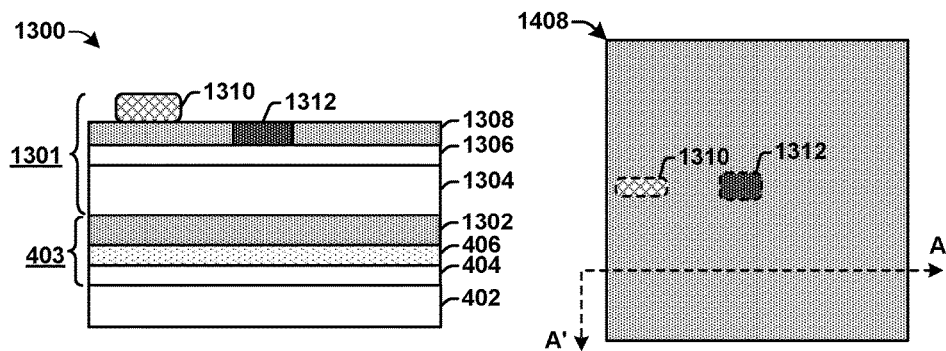
FIGS. 13-20 illustrate some embodiments of exemplary substrates showing a method of performing a self-aligned litho-etch process.

FIG. 13 illustrates some embodiments of a cross-sectional view 1300 and a corresponding to acts 1202-1206.

As shown in cross-sectional view 1300, a tri-layer hard mask 403 is disposed over a semiconductor body 402. The tri-layer hard mask 403 comprises a lower-layer 404, a central-layer 406, and an upper-layer 1302. In some embodiments, the lower-layer 404 comprises a titanium nitride (TiN) layer disposed over the semiconductor body 402. In some embodiments, the central-layer 406 comprises a TEOS layer disposed over the TiN layer. In some embodiments, the upper-layer 1302 of comprises a silicon layer disposed over the TEOS layer.

A cut definition layer 1301 is disposed over the tri-layer hard mask 403. The cut definition layer 1301 comprises a bottom layer 1304, a middle layer 1306, a hard mask layer 1308, and a blocking layer 1310. In some embodiments, the bottom layer 1304 comprises a carbon layer. In some embodiments, the middle layer 1306 and the blocking layer 1310 may comprise a first low-temperature film, while the hard mask layer 1308 comprises a different, second low-temperature film.

In some embodiments, the first low-temperature film of the middle layer 1306 and the blocking layer 1310 comprise a low-temperature oxide film. In some embodiments, the second low-temperature film of the hard mask layer 1308 comprises a low-temperature TiN film. In some embodiments the low-temperature oxide film and the low-temperature TiN film are formed at a temperature having a range of between approximately 100° C. and approximately 200° C. In other embodiments, the first low-temperature film and the second low-temperature film may comprise other materials having an etching selectivity of greater than 6 (i.e., the first low-temperature film etches more than 6 times faster than the second low-temperature film).

The blocking layer is selectively etched to form a first cut layer disposed over the hard mask layer 1308. The first cut layer defines a first cut position for a first plurality of shapes of a SALE design layer formed using a first photolithography process of a SALE lithography process. A second cut layer opening 1312 is selectively formed within the hard mask layer 1308 to define a second cut position for a second plurality of shapes of the SALE design layer formed using a second photolithography process of the SALE lithography process. In some embodiments, the second cut layer opening 1312 is formed by selectively etching the hard mask layer 1308 to form an opening.

Figure 14:
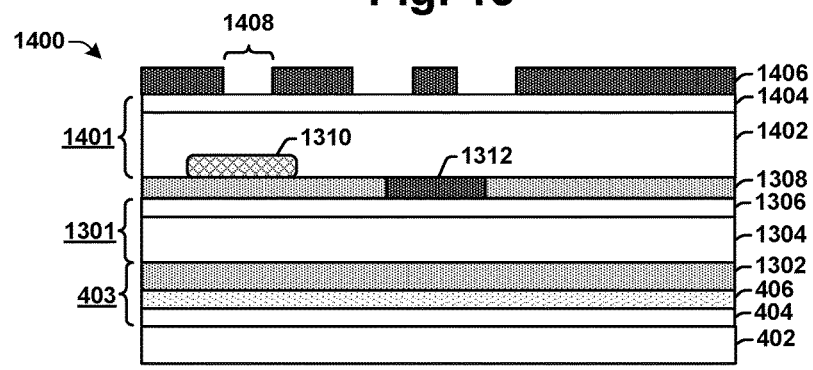

FIG. 14 illustrates some embodiments of a cross-sectional view 1400 of a substrate corresponding to acts 1208-1210.

As shown in cross-sectional view 1400, a first pattern transfer layer 1401 is formed over the first cut layer 1310 and the second cut layer opening 1312. A first patterned photoresist layer 1406 is formed over the first pattern transfer layer 1401. The first patterned photoresist layer 1406 comprises openings 1408 that correspond to locations of the first plurality of shapes.

The first pattern transfer layer 1401 is configured to transfer a pattern from an overlying first patterned photoresist layer 1406 to the hard mask layer 1308. In some embodiments, the first pattern transfer layer 1401 may comprise a bottom layer 1402 formed over the first cut layer 1310 and the second cut layer opening 1312, and a middle layer 1404 formed over the bottom layer 1402. In some embodiments, the bottom layer 1402 may comprise a carbon layer or a hydrogen layer deposited using a vapor deposition technique or a spin-on technique. In some embodiments, the middle layer 1404 may comprise a silicon oxide layer.

Figure 15:
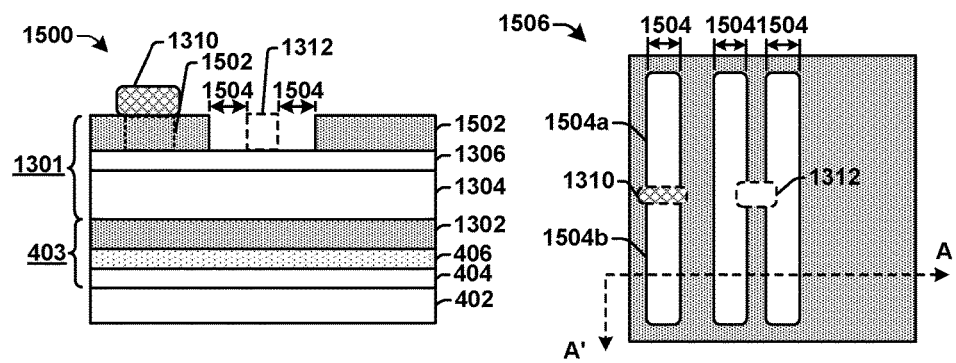

FIG. 15 illustrates some embodiments of a cross-sectional view 1500 and a corresponding top-view 1506 of a substrate corresponding to act 1212.

As shown in cross-sectional view 1500, hard mask layer 1502 (e.g., corresponding to 1308) is etched according to the first patterned photoresist layer 1406 and the first cut layer 1310. Etching the hard mask layer 1502 selectively removes portions of the hard mask layer 1502 to form openings 1504 that expose middle layer 1306. Since the first cut layer 1310 comprises a blocking layer overlying the hard mask layer 1308, the middle layer 1306 is not exposed in the area of the first cut layer 1310. Since the second cut layer opening 1312 comprises an opening in hard mask layer 1308, the middle layer 1306 is exposed in the area of second cut layer opening 1312.

As shown in top-view 1506, the openings 1504 formed by etching the hard mask layer 1308 of the tri-layer hard mask 403 according to the first patterned photoresist layer 1406 intersect the second cut layer opening 1312 to form an 'H' shaped opening in the hard mask layer 1308. The openings 1504 further abut the first cut layer 1310, in a manner such that the first cut layer 1310 separates openings 1504a and 1504b.

Figure 16:
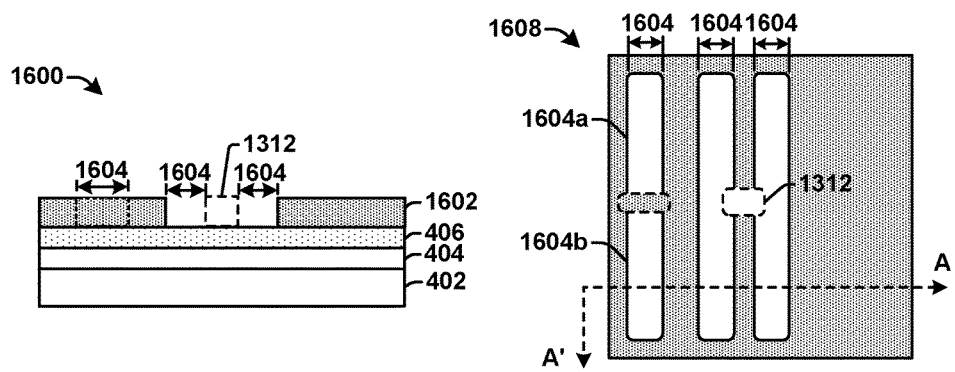

FIG. 16 illustrates some embodiments of a cross-sectional view 1600 and a corresponding top-view 1608 of a substrate corresponding to act 1214-1218.

As shown in cross-sectional view 1600, upper-layer 1602 of the tri-layer hard mask 403 is selectively etched according to the cut definition layer 1301 causing openings in the hard mask layer 1308 to be transferred as a first plurality of openings 1604 in the upper-layer 1602, which correspond to the first plurality of shapes. The cut definition layer 1301 is then removed. As shown in top-view 1608, the resulting upper-layer 1602 of the tri-layer hard mask 403 extends between openings 1604a and 1604b.

Figure 17:
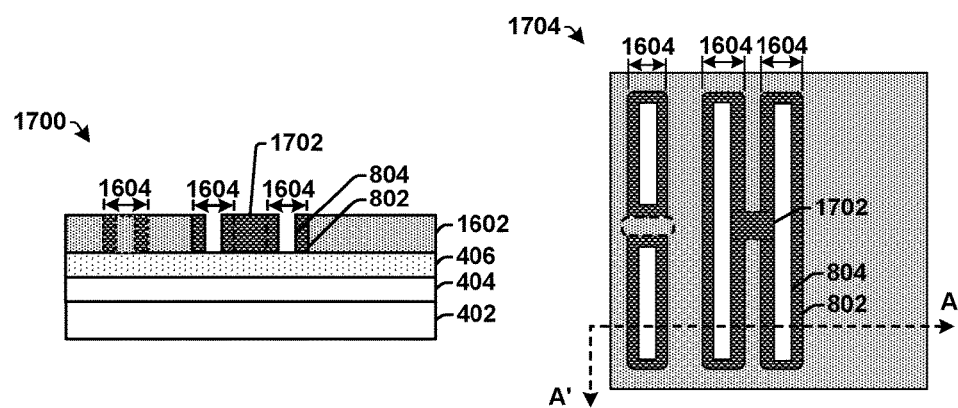

FIG. 17 illustrates some embodiments of a cross-sectional view 1700 and a corresponding top-view 1704 of a substrate corresponding to act 1220.

As shown in cross-sectional view 1700, a spacer material 802 is formed onto sidewalls of the etched upper-layer 1602 of the tri-layer hard mask 403. The spacer material 802 fills the second cut layer opening 1312 in the multi-layer hard mask 403 to form a second cut layer 1702. In some embodiments, the spacer material 802 may be formed by depositing spacer material over the substrate and by subsequently etching the spacer material to remove the spacer material from horizontal surfaces. The resulting spacer material 802 remains on sidewalls of the etched upper-layer 1602 of the tri-layer hard mask 403 leaving a reduced width opening 804 exposing the underlying central-layer 406 of the tri-layer hard mask 403 at locations defining the first plurality of shapes.

As shown in top-view 1704, the spacer material 802 forms a border around the openings 1606 in the upper-layer 1602 of the tri-layer hard mask 403, thereby reducing the width of exposed regions of the middle-layer 406 of the tri-layer hard mask 403.

Figure 18:
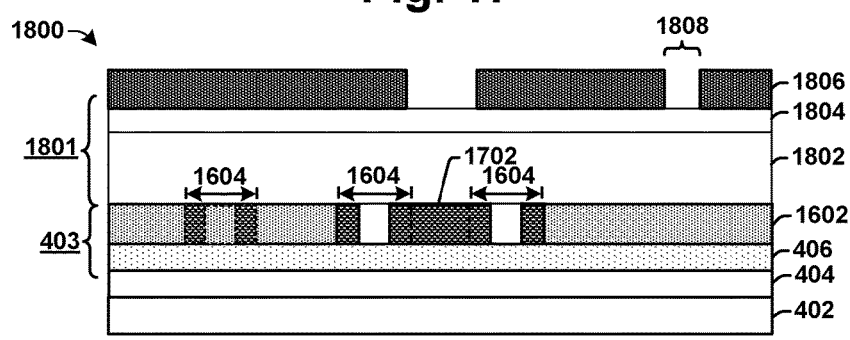

FIG. 18 illustrates some embodiments of a cross-sectional view 1800 of a substrate corresponding to acts 1222-1224.

As shown in cross-sectional view 1800, a second pattern transfer layer 1801 is formed a position overlying the spacer material 802. In some embodiments, the second pattern transfer layer 1801 comprises a bottom layer 1802 deposited over the spacer material 802, and a middle layer 1804 deposited over the bottom layer 1802. A second patterned photoresist layer 1806 is formed over the second pattern transfer layer 1801. The second patterned photoresist layer 1806 comprises openings 1808 that correspond to locations of the second plurality of shapes.

Figure 19:
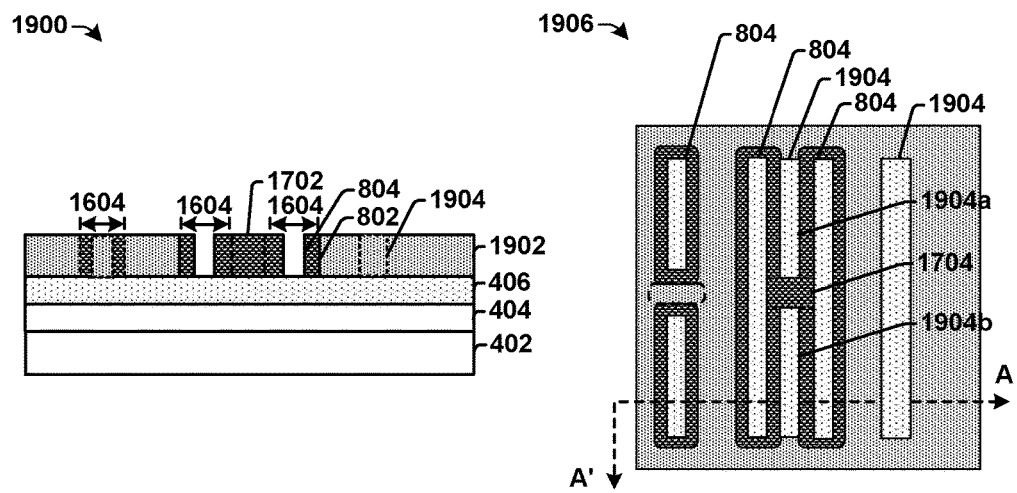

FIG. 19 illustrates some embodiments of a cross-sectional view 1900 and a corresponding top-view 1906 of a substrate corresponding to act 1226.

As shown in cross-sectional view 1900, the upper-layer 406 of the tri-layer hard mask 403 is selectively etched according to the second patterned photoresist layer 1806 and the spacer material 802 comprising the second cut layer 1702. Etching the upper-layer 406 of the tri-layer hard mask 403 forms a second plurality of openings 1904 corresponding to the second plurality of shapes. The second plurality of openings 1904 that expose the underlying central-layer 406 of the tri-layer hard mask 403.

Figure 20:
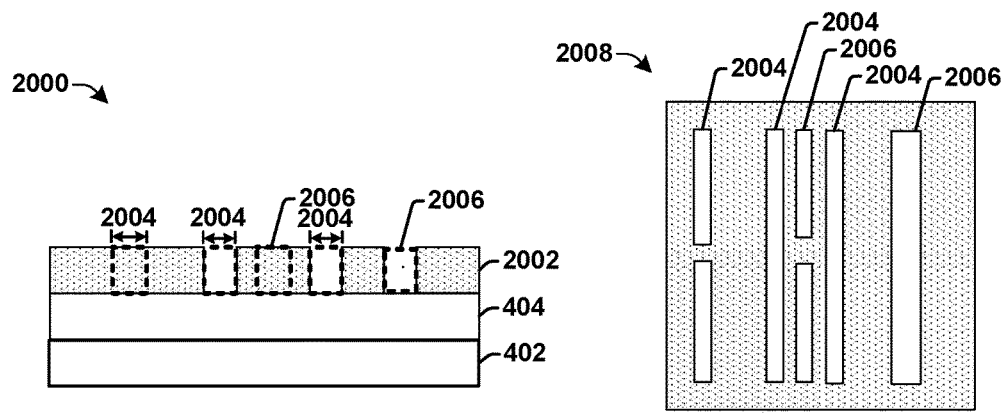

FIG. 20 illustrates some embodiments of a cross-sectional view 2000 and a corresponding top-view 2008 of a substrate corresponding to act 1228.

As shown in cross-sectional view 2000 and top-view 2008, the central-layer 1102 of the tri-layer hard mask 403 is selectively etched according to the first and second plurality of openings, 804 and 1904, defined by the upper-layer 1902 of the tri-layer hard mask 403 and the spacer material 802, to respectively form openings 2004 and 2006 in the central-layer 2002.

Figure 21:
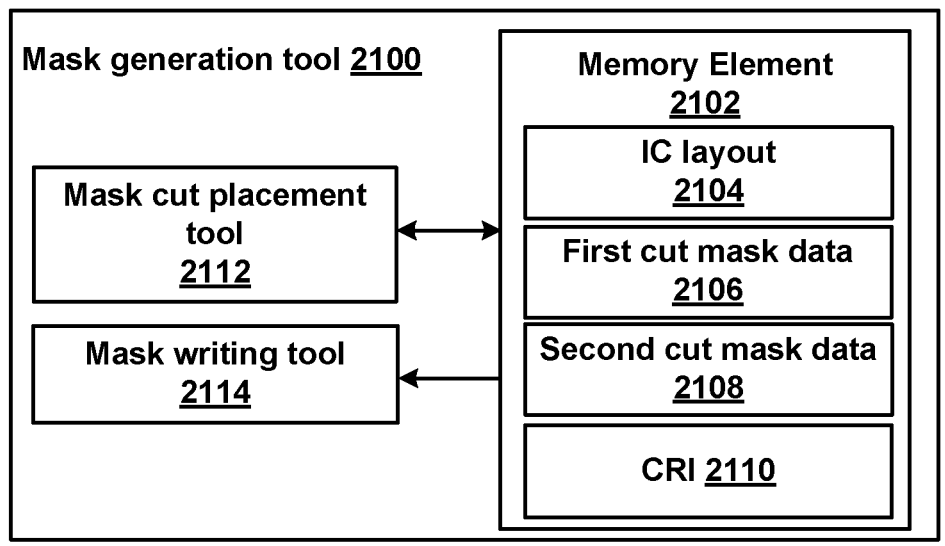
FIG. 21 illustrates a block diagram of some embodiments of a mask generation tool configured to perform self-aligned a litho-etch process.

FIG. 21 illustrates a block diagram of some embodiments of a mask generation tool 2100 configured to perform self-aligned a litho-etch process The mask generation tool 2100 comprises a memory element 2102. In various embodiments the memory element 2102 may comprise an internal memory or a computer readable medium. The memory element 2102 is configured to store an integrated chip (IC) layout 2104 comprising a graphical representation of an integrated chip. The IC layout 2104 comprises a first plurality of shapes of a self-aligned litho-etch (SALE) design layer formed using a first SALE lithography process and a second plurality of shapes of the design layer formed using a second SALE lithography process. In some embodiments, the SALE design layer may comprise a design layer within a static random access memory (SRAM) cell. In some embodiments, the IC layout 2104 may comprise a GDS or GDSII file, a CIF file, an OASIS file, or other similar file formats.

The memory element 2102 is further configured to store first cut layer data 2106 and second cut layer data 2108. The first cut layer data 2106 defines a first cut position for the first plurality of shapes of the SALE design layer. The second cut layer data 2108 defines a second cut position for the second plurality of shapes of the SALE design layer. In some embodiments, the memory element 2102 is further configured to store computer readable instructions 2110. The computer readable instructions 2110 may provide for a method of operating one or more components of the mask generation tool according to a disclosed method (e.g., method 100, 300, or 1200).

A mask cut placement tool 2112 is configured to access the IC layout 2104 and to determine a position of the first and second cut layers. For example, in some embodiments, the mask cut placement tool 2112 is configured to determine a location of a first cut within the first plurality of shapes from the first cut layer data 2106, and to determine a location of a second cut within the first second of shapes from the second cut layer data 2108.

A mask writing tool 2114 is configured to access the first cut layer data 2106 and the second cut layer data 2108. Based upon the first cut layer data 2106, the mask writing tool 2114 is configured to generate a first cut mask. Based upon the second cut layer data 2108, the mask writing tool 2114 is configured to generate a second cut mask. The first cut mask is configured to cut the first plurality of shapes and the second cut mask is configured to cut the second plurality of shapes.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the disclosed IC layouts are illustrated as comprising a plurality of design shapes comprising square or rectangles, it will be appreciated that such shapes are not limiting. Rather, the disclosed method and apparatus may be applied to designs having design shapes of any geometry allowed by design rules.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a method and apparatus for performing a self-aligned litho-etch process.

In some embodiments, the present disclosure relates to an integrated chip. The integrated chip includes a first plurality of shapes of an integrated chip layer arranged along a first direction at a first pitch and comprising a first two shapes separated by a first end-to-end space along a second direction perpendicular to the first direction. The integrated chip further includes a second plurality of shapes of the integrated chip layer arranged along the first direction at a second pitch and comprising a second two shapes separated by a second end-to-end space along the second direction. A ratio of the first end-to-end space to the second end-to-end space is approximately equal to 2.5:1.

In other embodiments, the present disclosure relates to an integrated chip. The integrated chip includes a first plurality of shapes of an integrated chip layer arranged along a first direction and comprising a first two shapes separated by a first end-to-end space along a second direction perpendicular to the first direction. The integrated chip further includes a second plurality of shapes of the integrated chip layer arranged along the first direction at locations interleaved between adjacent ones of the first plurality of shapes, wherein the second plurality of shapes have a second two shapes separated by a second end-to-end space along the second direction. A ratio of the first end-to-end space to the second end-to-end space is approximately equal to 2.5:1.

In yet other embodiments, the present disclosure relates to a method of a self-aligned litho-etch (SALE) process. The method includes forming a first cut layer on a first cut definition layer over a multi-layer hard mask comprising an upper layer and a lower layer, and forming a cut layer opening within the first cut definition layer. The cut definition layer is etched according to a first patterned photoresist layer and the first cut layer, and the upper layer is etched according to the cut definition layer to form a first plurality of openings within the upper layer. A spacer material is deposited within the first plurality of openings and a second cut definition layer is formed over the upper layer and the spacer material. The second cut definition layer is etched according to a second patterned photoresist layer, and the upper-layer is etched according to the second cut definition layer to form a second plurality of openings within the upper layer. The lower-layer is etched according to the first plurality of openings and the second plurality of openings.

What is claimed is:

1. An integrated chip, comprising:
   a first plurality of shapes of an integrated chip layer arranged along a first direction at a first pitch and comprising a first two shapes separated by a first end-to-end space along a second direction perpendicular to the first direction;
   a second plurality of shapes of the integrated chip layer arranged along the first direction at a second pitch and comprising a second two shapes separated by a second end-to-end space along the second direction; and
   wherein a ratio of the first end-to-end space to the second end-to-end space is approximately equal to 2.5:1.

2. The integrated chip of claim 1, wherein the integrated chip layer comprises a gate layer or a back-end-of-the-line metallization layer.

3. The integrated chip of claim 1, wherein the second two shapes are arranged between adjacent ones of the first plurality of shapes in the first direction.

4. The integrated chip of claim 3, wherein the second end-to-end space is larger than a distance between the second two shapes and one of the adjacent ones of the first plurality of shapes.

5. The integrated chip of claim 3, wherein the second end-to-end space is less than or equal to twice a distance between the second two shapes and one of the adjacent ones of the first plurality of shapes.

6. The integrated chip of claim 3, wherein the first end-to-end space is greater than twice a distance between the second two shapes and one of the adjacent ones of the first plurality of shapes.

7. The integrated chip of claim 3, wherein the adjacent ones of the first plurality of shapes continuously extend past the second end-to-end space on opposing sides of the second two shapes.

8. The integrated chip of claim 1, wherein the first two shapes are separated from the second two shapes in the first direction by a distance that is not a multiple of the first pitch.

9. The integrated chip of claim 1, wherein the first plurality of shapes comprise:
   a first shape;
   a second shape separated from the first shape in the second direction by the first end-to-end space;
   a third shape separated from the first shape in the first direction; and
   a fourth shape separated from the third shape in the first direction.

10. The integrated chip of claim 9, wherein the second plurality of shapes comprise:

a fifth shape arranged between the third shape and the fourth shape in the first direction;

a sixth shape arranged between the third shape and the fourth shape in the first direction and separated from the fifth shape in the second direction by the second end-to-end space; and a seventh shape separated from fifth shape by the fourth shape.

11. The integrated chip of claim 10, wherein the fifth shape has a first side facing the third shape and a second side facing the fourth shape; and wherein the first side is separated from the third shape by a first distance that is equal to a second distance separating the second side from the fourth shape.

12. An integrated chip, comprising:

a first plurality of shapes of an integrated chip layer arranged along a first direction and comprising a first two shapes separated by a first end-to-end space along a second direction perpendicular to the first direction; and a second plurality of shapes of the integrated chip layer arranged along the first direction at locations interleaved between adjacent ones of the first plurality of shapes, wherein the second plurality of shapes comprise a second two shapes separated by a second end-to-end space along the second direction; and wherein a ratio of the first end-to-end space to the second end-to-end space is approximately equal to 2.5:1.

13. The integrated chip of claim 12, wherein the integrated chip layer comprises a gate layer or a back-end-of-the-line metallization layer.

14. The integrated chip of claim 12, wherein the second two shapes respectively have a first side facing a first one of the first plurality of shapes and a second side facing a second one of the first plurality of shapes; and wherein the first side is separated from the first one of the first plurality of shapes by a first distance that is equal to a second distance separating the second side from the second one of the first plurality of shapes.

15. The integrated chip of claim 14, wherein the second end-to-end space is larger than a distance between the second two shapes and one of the adjacent ones of the first plurality of shapes.

16. The integrated chip of claim 14, wherein the second end-to-end space is less than or equal to twice a distance between the second two shapes and one of the adjacent ones of the first plurality of shapes.

17. The integrated chip of claim 14, wherein the first end-to-end space is greater than twice a distance between the second two shapes and one of the adjacent ones of the first plurality of shapes.

18. The integrated chip of claim 14, wherein the adjacent ones of the first plurality of shapes continuously extend past the second end-to-end space on opposing sides of the second two shapes.

19. The integrated chip of claim 12, wherein the first plurality of shapes are arranged along the first direction at a first pitch; and wherein the first two shapes are separated from the second two shapes by a distance that is not a multiple of the first pitch.

20. An integrated chip, comprising:

a first plurality of shapes of an integrated chip layer comprising a first two shapes having line ends with equal first widths that are separated by a first end-to-end space along a first direction;

a second plurality of shapes of the integrated chip layer comprising a second two shapes having line ends with equal second widths that are separated by a second end-to-end space along the first direction, wherein the second two shapes have opposing sides that are separated from two of the first plurality of shapes by a side-to-side space along a second direction that is perpendicular to the first direction; and wherein the second end-to-end space is less than or equal to twice the side-to-side space and the first end-to-end space is approximately 2.5 times larger than the second end-to-end space.

\* \* \* \* \*